US012300586B2

(12) United States Patent
Lee

(10) Patent No.: US 12,300,586 B2
(45) Date of Patent: May 13, 2025

(54) LEADLESS SEMICONDUCTOR PACKAGE WITH INTERNAL GULL WING LEAD STRUCTURES

(71) Applicant: NXP USA, INC., Austin, TX (US)

(72) Inventor: Pat Lee, Kaohsiung (TW)

(73) Assignee: NXP USA, Inc., Austin, TX (US)

( * ) Notice: Subject to any disclaimer, the term of this patent is extended or adjusted under 35 U.S.C. 154(b) by 232 days.

(21) Appl. No.: 17/551,370

(22) Filed: Dec. 15, 2021

(65) Prior Publication Data

US 2023/0187327 A1    Jun. 15, 2023

(51) Int. Cl.
  *H01L 23/498*  (2006.01)
  *H01L 21/48*   (2006.01)
  *H01L 21/56*   (2006.01)
  *H01L 23/00*   (2006.01)

(52) U.S. Cl.
  CPC .... *H01L 23/49805* (2013.01); *H01L 21/4839* (2013.01); *H01L 21/565* (2013.01); *H01L 21/568* (2013.01); *H01L 24/16* (2013.01); *H01L 24/81* (2013.01); *H01L 2224/16245* (2013.01); *H01L 2224/81005* (2013.01); *H01L 2224/81815* (2013.01); *H01L 2924/182* (2013.01)

(58) Field of Classification Search
  CPC ........... H01L 23/49805; H01L 21/4839; H01L 21/565
  See application file for complete search history.

(56) References Cited

U.S. PATENT DOCUMENTS

| 7,476,976 B2 | 1/2009 | Lange et al. |
| 2004/0041249 A1* | 3/2004 | Tsai ..................... H01L 25/0657 257/E25.013 |
| 2004/0164382 A1 | 8/2004 | Gerber et al. |
| 2005/0093177 A1* | 5/2005 | Liu .................... H01L 23/49551 257/E23.047 |
| 2009/0160039 A1* | 6/2009 | Wong .................. H01L 23/3107 257/E23.033 |
| 2009/0230517 A1* | 9/2009 | Bathan .................... H01L 25/03 438/109 |
| 2013/0127029 A1* | 5/2013 | Lee .................... H01L 23/49503 257/676 |

* cited by examiner

*Primary Examiner* — Errol V Fernandes

(57) ABSTRACT

A leadless semiconductor package includes a plurality of internal gull wing leads forming a concave region and an IC die disposed in the concave region and having a plurality of conductive bumps at a first surface connected to corresponding proximal sections of the internal gull wing leads. Distal ends of the internal gull wing leads form surface mount pads at a mounting surface of the leadless semiconductor package for mounting the package to a circuit board. Packaging encapsulant extends between the mounting surface and an opposing surface of the package and encapsulates the first surface of the IC die and the proximal ends of the internal gull wing lead structures. In some implementations, the mounting surface further includes a second surface of the IC die opposite the first surface and thus a thermally conductive material may be disposed between the second surface of the IC die and the circuit board.

12 Claims, 5 Drawing Sheets

LEADLESS SEMICONDUCTOR PACKAGE WITH INTERNAL GULL WING LEAD STRUCTURES

BACKGROUND

Flat leadless packages, such as quad-flat no-leads (QFN) packages and dual-flat no-leads (DFN) packages, are surface mount (SMT) semiconductor packages that encapsulate one or more integrated circuit (IC) die and provide electrical connections between the IC die and a printed circuit board (PCB) or other circuit board via a metal leadframe that forms conductive pads (or lands) on the "bottom" surface of the package. In conventional QFN packages, these conductive pads are the distal ends of "long finger" structures that extend from the interior of the leadframe to the perimeter of the package. The pads of an IC die are connected to the proximal ends of these long finger structures via either wire bonding or a flip chip process. When employing a flip chip approach, pads of the IC die are connected to proximal ends of corresponding long finger structures of the leadframe via solder bumps or pillars and a solder reflow process is performed. However, because of the half-etching process typically performed to form the long finger structures of the leadframe, the resulting long finger structures often exhibit low co-planarity, which can be exacerbated during the relatively long and relatively high-temperature solder reflow process. Such low finger co-planarity can lead to poor solder reflow connectivity results. Conventional solutions, such as the use of support bars for the long finger structures during solder reflow, often cannot satisfactorily resolve the deformation introduced by the solder reflow process due to the frequent presence of dimension tolerance mismatch between the dimensions of the long finger structures and the support bar structures, which can lead to misorientation, or "tilt", of the long finger structures by the support bar structure.

SUMMARY OF EMBODIMENTS

In accordance with one aspect, a leadless semiconductor package includes a plurality of internal gull wing leads forming a concave region and further includes an integrated circuit (IC) die disposed in the concave region and having a plurality of conductive bumps at a first surface connected to corresponding proximal sections of the internal gull wing leads.

Distal ends of the internal gull wing leads form surface mount pads at a mounting surface of the leadless semiconductor package.

Implementations of the leadless semiconductor package can include one or a combination of the following features. The mounting surface further includes a second surface of the IC die opposite the first surface. Packaging encapsulant extending between the mounting surface and an opposing surface of the leadless semiconductor package and encapsulating the first surface of the IC die and the proximal sections of the internal gull wing lead structures. The internal gull wing leads are part of a leadframe.

In accordance with another aspect, an electronic device comprises a circuit board having the leadless semiconductor package mounted thereon. The mounting surface can further include a second surface of the IC die opposite the first surface, and the electronic device can further comprise thermally conductive material extending between the second surface of the IC die and a facing surface of the circuit board.

In accordance with another aspect, a leadless semiconductor package includes a first surface and an opposing second surface and a leadframe having a plurality of internal lead structures extending from an interior of the leadframe to a perimeter of the leadframe, each internal lead structure having a proximal section interiorly offset from the first surface, a distal section located proximate to the perimeter of the leadframe and having an external surface that is co-planar with the first surface, and a transitional section extending between the proximal section and the distal section. The leadless semiconductor package further includes an IC die disposed in a concave region formed by the plurality of internal lead structures, the IC die having a third surface facing the proximal sections of the plurality of internal lead structures and an opposing fourth surface, the third surface having a plurality of conductive bumps, each conductive bump connecting the IC die with a proximal section of a corresponding internal lead structure of the plurality of internal lead structures.

Implementations of the leadless semiconductor package can include one or a combination of the following features. Packaging encapsulant extending between the first surface and the second surface. The fourth surface is exposed at the first surface. The fourth surface is co-planar with the first surface.

In accordance with yet another aspect, an electronic device comprises a circuit board having the leadless semiconductor package mounted thereon. The mounting surface can further include a second surface of the IC die opposite the first surface, and the electronic device can further comprise thermally conductive material extending between the second surface of the IC die and a facing surface of the circuit board.

In accordance with yet another aspect, a method of fabricating a leadless semiconductor package includes forming a leadframe having a plurality of internal gull wing lead structures that define a concave region, each gull wing lead structure having a proximal section and an opposing distal section proximate and internal to a perimeter of the leadless semiconductor package, a surface of the distal section forming a surface mount pad of the leadless semiconductor package. The method further includes affixing an integrated circuit (IC) die to the leadframe in the concave region such that each conductive bump of a plurality of conductive bumps of a first surface of the IC die is connected to a proximal end of a corresponding gull wing lead structure of the plurality of internal gull wing lead structures.

Implementations of the method can include one or a combination of the following features. Affixing the IC die to the leadframe includes adhering a first fabrication tape to surfaces of the proximal sections of the internal gull wing lead structures opposite the concave region and performing a solder reflow process to reflow solder to form the plurality of conductive bumps while the first fabrication tape is adhered. The method further including Removing the first fabrication tape after the solder reflow process and adhering a second fabrication tape to the surfaces of the distal sections of the internal gull wing lead structures and performing a molding process to at least partially encapsulate the leadframe and the IC die using the second fabrication tape as a molding barrier. The second fabrication tape can be further adhered to a second surface of the IC die opposite the first surface, with the second surface of the IC die being part of a mounting surface of the leadless semiconductor package. The method can further include removing the second fabrication tape and performing a singulation process to separate the leadless semiconductor package from other workpieces. A second surface of the IC die can be co-planar with the surfaces of the distal sections of the internal gull wing lead structures.

In accordance with a further aspect, a leadless semiconductor package is formed in accordance with the above-described method.

BRIEF DESCRIPTION OF THE DRAWINGS

The present disclosure is better understood, and its numerous features and advantages made apparent to those skilled in the art, by referencing the accompanying drawings. The use of the same reference symbols in different drawings indicates similar or identical items.

DETAILED DESCRIPTION

Figure 1:
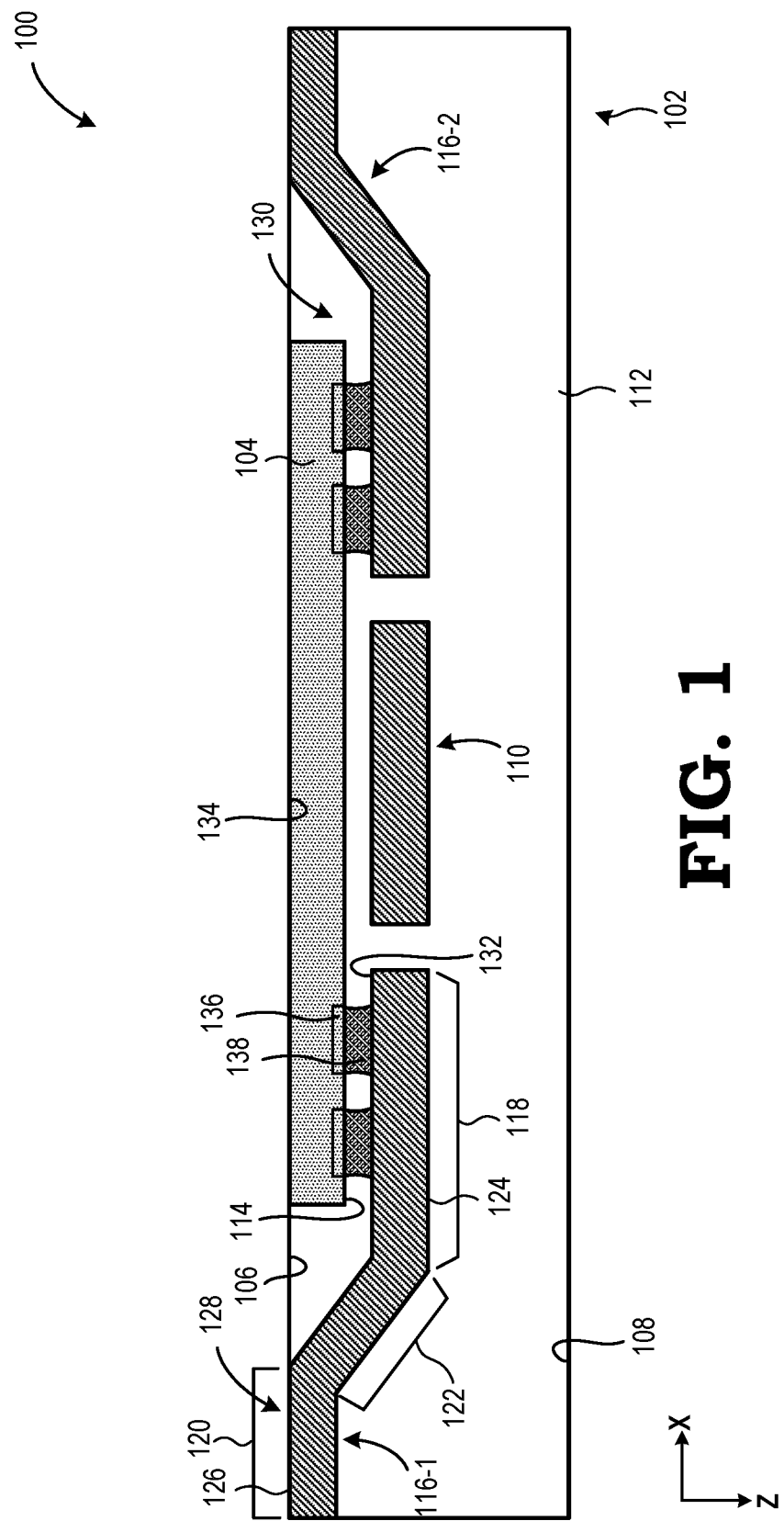
FIG. 1 is a diagram illustrating cross-section view of a leadless semiconductor package utilizing a leadframe with internal gull wing finger structures in accordance with some embodiments.

Conventional QFN, DFN, and other flat no-lead semiconductor package configurations that utilize a flip chip process to connect to the long finger structures of a leadframe risk poor solder connectivity due to loss of long finger co-planarity due to deformation introduced during the solder reflow process. FIGS. 1-5 below illustrate embodiments of a leadless semiconductor package having internal gullwing fingers that mitigate some or all of the IC-to-leadframe connectivity issues during the solder reflow of the flip chip process, as well as methods for manufacture of such packages. Rather than employing a leadframe with long planar finger structures to provide a conductive path between the bumps of an IC die and the corresponding surface mount pad of the package containing the IC die, in at least one embodiment the semiconductor packages described herein employ a leadframe with a set of internal gull wing lead structures that extend from an interior of the semiconductor package to a perimeter of the mounting surface of the semiconductor package. Each internal gull wing lead structure has a proximal section that is interiorly offset from the mounting surface, a distal section that has an external surface that is co-planar with the mounting surface at its perimeter, and a transitional section that extends between the proximal and distal sections. With this configuration, the plurality of internal gull wing lead structures form a concave region in which one or more IC die are positioned, with the pads of the one or more IC die electrically and mechanically coupled with corresponding proximal sections of the gull wing lead structure via solder bumps or other conductive bumps. The leadframe and IC die are at least partially encapsulated with a package encapsulant, with the resulting semiconductor package utilizing the exterior-facing surfaces of the distal sections of the internal gull wing lead structures as surface mount pads for the semiconductor package. Further, in some embodiments, the top, or non-active, surface of the IC die disposed within the concave region is co-planar with the mounting surface of the semiconductor package such that the top surface of the IC die is flush with the mounting surface, and thus may be thermally coupled directly with the underlying circuit board or a co-located heat sink using a thermally-conductive adhesive, thermally-conductive tape, or other thermally-conductive material between the top surface of the IC die and the facing surface of the circuit board or heat sink.

This configuration of leadframe and IC die mounting facilitates fabrication of the semiconductor package via the use of tape to support a bottom of the leadframe workpiece while the one or more IC die are being mounted in the concave region formed by the gull wing leads of the leadframe. As a result, the internal gull wing lead structures can be provided with sufficient mechanical support during the solder reflow process during the mounting of the IC die so as to reduce or eliminate the distortion of the co-planarity of the lead structures during the reflow process, and thus provide more reliable die pad-to-lead bonding compared to QFN and other leadless flat packages that utilize half-etched long fingers to provide die-pad to surface-mount connectivity. Moreover, because the gull wing lead structures, the IC die, and the solder bumps connecting the IC die to the gull wing lead structures can be dimensioned so that the top surface of the IC die is flush with the mounting surface of the resulting semiconductor package, direct external access to the IC die can be provided for any of a variety of thermolysis solutions.

Note that in the following, certain orientational terms, such as top, bottom, front, back, and the like, are used in a relative sense to describe the positional relationship of various components. These terms are used with reference to the relative position of components either as shown in the corresponding figure or as used by convention in the art and are not intended to be interpreted in an absolute sense with reference to a field of gravity. Thus, for example, a surface shown in the drawing and referred to as a top surface of a component would still be properly understood as being the top surface of the component, even if, in implementation, the component was placed in an inverted position with respect to the position shown in the corresponding figure and described in this disclosure. Further, note that certain positional terms, such as co-planar or parallel, will be understood to be interpreted in the context of fabrication tolerances or industry standards. For example, co-planar shall be understood to mean co-planar within applicable tolerances as a result of one or more fabrication processes affecting the components indicated to be co-planar, or co-planar within a tolerance utilized in the appropriate industry or fabrication technology. Moreover, it will be appreciated that for simplicity and clarity of illustration, components shown in the figures have not necessarily been drawn to scale. For example, the dimensions of some of the components may be exaggerated relative to other components.

FIG. 1 illustrates a cross-section view 100 (FIG. 1) along a cutline 2-2 (FIG. 2) of a leadless semiconductor package 102 (hereinafter, "package 102") employing internal gull wing lead structures for die-to-surface connectivity and package surface mounting in accordance with some embodiments. The package 102 encapsulates one or more IC die 104 and is configured to surface mount to a printed circuit board (PCB) or other circuit board of an electronic device (not shown in FIG. 1). In particular, the package 102 implements a flat, no-lead package configuration in which the surface mount pads (or "leads") are implemented on the periphery of a bottom surface 106 of the package 102.

As shown, the package 102 has the bottom surface 106 and an opposing surface 108, with the bottom surface 106 serving as the mounting surface by which the package 102 is mounted to a PCB or other circuit board of an electronic device (not shown). As such, the bottom surface 106 is referred to herein as the "mounting surface 106" and the opposing surface 108 referred to herein as the "top surface 108." In the depicted embodiment, the package 102 is composed of a stack of structures/layers, including the one or more IC die 104, a leadframe 110, and a package encapsulant 112 extending between the mounting surface 106 and the top surface 108 of the package 102.

The leadframe 110 is composed of conductive material, such as one or more metals or metal alloys, such as copper (Cu), aluminum (Al), a copper alloy, an aluminum alloy, an iron (Fe)-nickel (Ni) alloy (e.g., Alloy 42), and the like. As is typical with leadframes in flat packages, the leadframe 110 serves both as a mounting structure for mounting the one or more IC die 104 of the package 102 as well as a structure for providing rigidity to the package 102 for manufacturing, handling, and mounting of the package 102. The leadframe 110 also serves as the conductive conduit for electrically coupling the pads at an active surface 114 of the IC die 104 (also known as the "top surface" of an IC die) with corresponding board pads (or lands) of the circuit board on which the package 102 is mounted.

Conventional QFN and other flat leadless packages utilize half-etching processes to etch a leadframe to form long fingers for providing IC die mounting, package mounting, and die-to-board connectivity. However, as noted above, this half-etching process leads to difficulties in supporting the long fingers of the leadframe during the solder reflow process of flip chip mounting, and thus often introduces significant non-co-planarity in the long fingers. To mitigate this risk while continuing to provide a flat no-lead package mounting solution, in at least one embodiment the leadframe 110 of the package 102 implements a set of internal gull wing lead structures 116, which are referred to herein as "gull wing leads 116" for purposes of brevity. For example, cross-section view 100 depicts two gull wing leads 116-1 and 116-2 of the leadframe 100. Each gull wing lead 116 includes a proximal section 118, a distal section 120, and a transitional section 122 that monolithically form the gull wing lead 116. The proximal section 118 is proximal to the center of the package 102, offset from the mounting surface 106 of the package, and extends toward the perimeter of the package 102 in a direction parallel with the mounting surface 106. In at least one embodiment, the "bottom" surfaces 124 of the proximal sections 118 of the set of gull wing leads 116 are co-planar. The distal section 120 is distal from the center of the package 102 and proximal to a corresponding edge of the perimeter of the package 102, and likewise extends from the perimeter toward the center of the package 102 in a direction parallel with the mounting surface 106. Further, in at least one embodiment, an exterior surface 126 of the distal section 120 is co-planar with the mounting surface 106 (that is, the distal section 120 is flush with the mounting surface 106) such that the exterior surface 126 is at the exterior of the package 102 and, as such, is used as a corresponding surface mount pad 128 (see FIG. 2) of the package 102. The transitional section 122 extends between the proximal section 118 and the distal section 120 at a non-zero angle relative to the mounting surface 106. That is, the transitional section 122 slants "up" as it transitions from the interiorly located position of the proximal section 118 to the surface-adjacent position of the distal section 120. This angle of transition may reflect any of a variety of parameters, including the die-to-package dimensions (with a larger package size relative to the die size facilitating a shallower transition angle), leadframe fabrication limitations or specifications, and the like.

This configuration of the gull wing leads 116 results in the set of gull wing leads 116 of the leadframe 110 forming a concave region 130 extending from the surfaces 126 of the distal sections 120 of the gull wing leads 116 to the "top" surfaces 132 of the proximal sections 118 of the gull wing leads 116. The one or more IC die 104 of the package 102 are positioned in this concave region 130 such that the active surface 114 faces the top surfaces 132 of the proximal sections 118 of the gull wing leads 116. The IC die 104 includes a plurality of die pads 136 disposed around the perimeter of the IC die 104 at the active surface 114, with each die pad 136 electrically coupled to corresponding circuitry of the IC die 104. Further, each die pad 136 is electrically and mechanically connected to the surface 132 of the proximal section 118 of a corresponding gull wing lead 116 via a solder bump 138 or other conductive structure to form an electrically conductive pathway between circuitry of the IC die 104 and the corresponding gull wing lead 116. In the illustrated embodiment, the IC die 104 has two die pads 136 connected to each gull wing lead 116 in this manner, but in other implementations there may be a one-to-one correspondence between die pads 136 and gull wing leads 116, more than two die pads 136 per gull wing lead 116, or a variable number of die pads 136 connected to gull wing leads (e.g., voltage/power supply connections may employ multiple die pads 136 per gull wing lead 116, whereas signal connections may employ a single die pad 136 per gull wing lead 116).

The package encapsulant 112 can include any of a variety of suitable encapsulant materials or combination thereof, such as plastics, epoxy resins, ceramics, and the like. As noted above, the package encapsulant 112 extends between the mounting surface 106 and the top surface 108 and encapsulates the leadframe 110 except for the exterior surfaces 126 of the distal sections 120 of the gull wing leads 116 and encapsulates at least the active surface 114 of the IC die 104 and the solder bumps 138 connecting the IC die 104 to the gull wing leads 116. In some embodiments, the non-active, or "bottom", surface 134 of the IC die 104 is substantially devoid of encapsulant material such that the non-active surface 134 is externally accessible via the mounting surface 106. This external accessibility can be achieved fabricating and dimensioning the gull wing leads 116 of the leadframe 110, the IC die 104, the solder bumps 138 and the die pads 136 such that the non-active surface 134 is co-planar with the mounting surface 106; that is, the non-active surface is flush with the mounting surface 106. Alternatively, in other embodiments the non-active surface 134 is interiorly offset from the mounting surface 106 and during the molding process, a temporary structure or technique creates an aperture in the package encapsulant 112 that extends from the mounting surface 106 to the non-active surface 134, either by preventing the positioning of encapsulant material in the region of the aperture, or by removing encapsulant material in the region of the aperture afterward. This exterior access to the surface 134 of the IC die 104 in the package 102 facilitates thermal solutions for the IC die 104, as described below with reference to FIG. 3.

Figure 2:
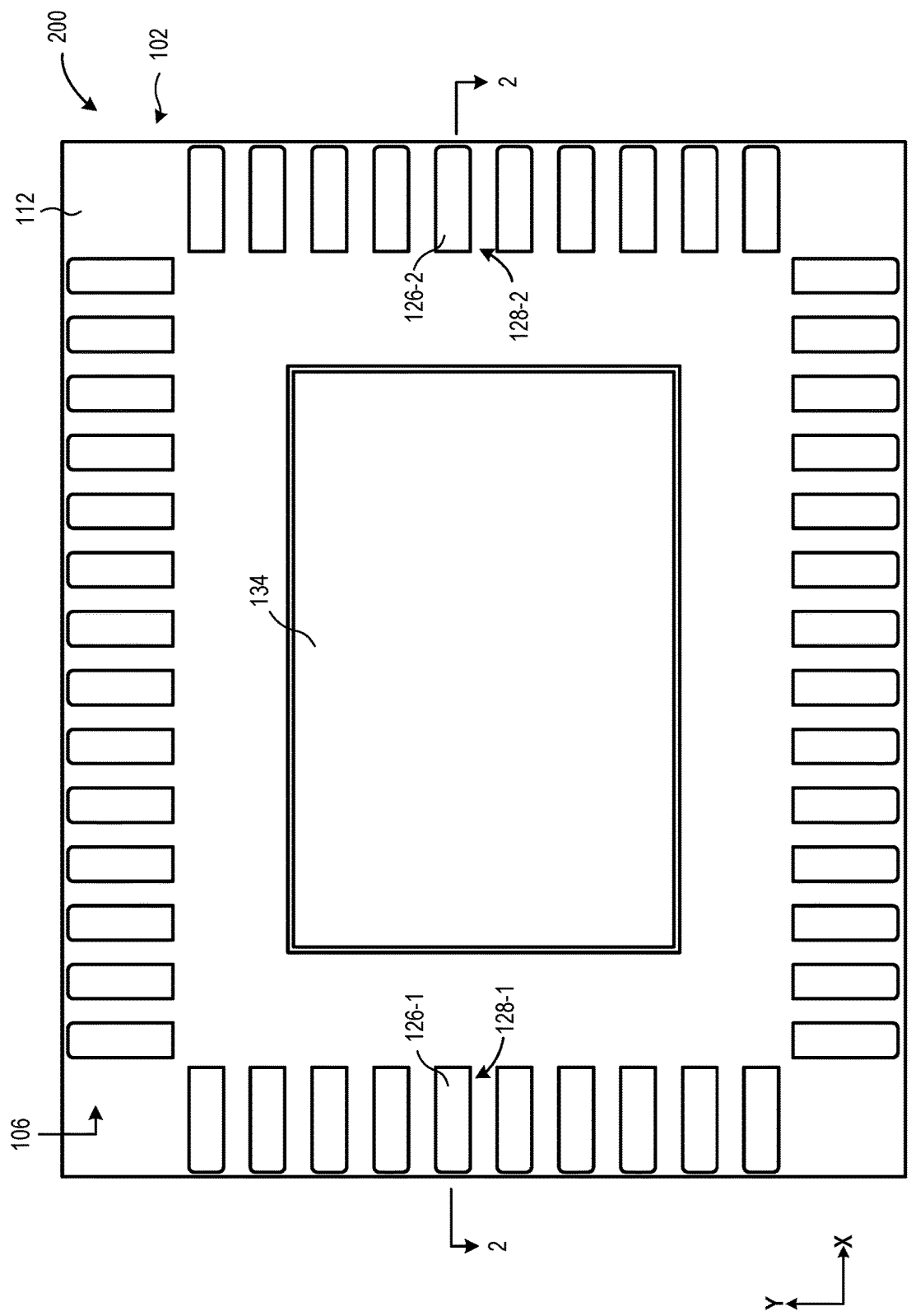
FIG. 2 is a diagram illustrating a bottom view of the leadless semiconductor package of FIG. 1 in accordance with some embodiments.

FIG. 2 illustrates a bottom view 200 of the package 102 in accordance with some embodiments. As described, the mounting surface 106 is formed from a bottom surface of the package encapsulant 112 along with the exterior surfaces 126 of the distal sections 120 of the gull wing leads 116

(such as the illustrated exterior surfaces 126-1 and 126-2 of the distal sections 120 of the gull wing leads 116-1 and 116-2, respectively). As the exterior surfaces 126 are co-planar, or flush, with the mounting surface 106 and thus accessible through the package encapsulant 112 at the mounting surface 106, the exterior surfaces 126 of the gull wing leads 116 serve as package surface mount pads 128 (e.g., the illustrated package surface mount pads 128-1 and 128-2) at the perimeter of the package 102. Although a 10×14 surface mount pad configuration is illustrated, it will be appreciated that a semiconductor package fabricated in accordance with the teachings provided herein can include any of a variety of pad number/array configurations. In the illustrated embodiment, the non-active surface 134 of the IC die 104 is also co-planar with the bottom surface of the package encapsulant 112 and thus serves as a central region of the mounting surface 106. However, in other embodiments, the IC die 104 may be fully encapsulated by the package encapsulant 112 or the IC die may be recessed, or offset, from the mounting surface 106 but externally accessed via an aperture in packaging encapsulant 112 at the mounting surface 106.

Figure 3:
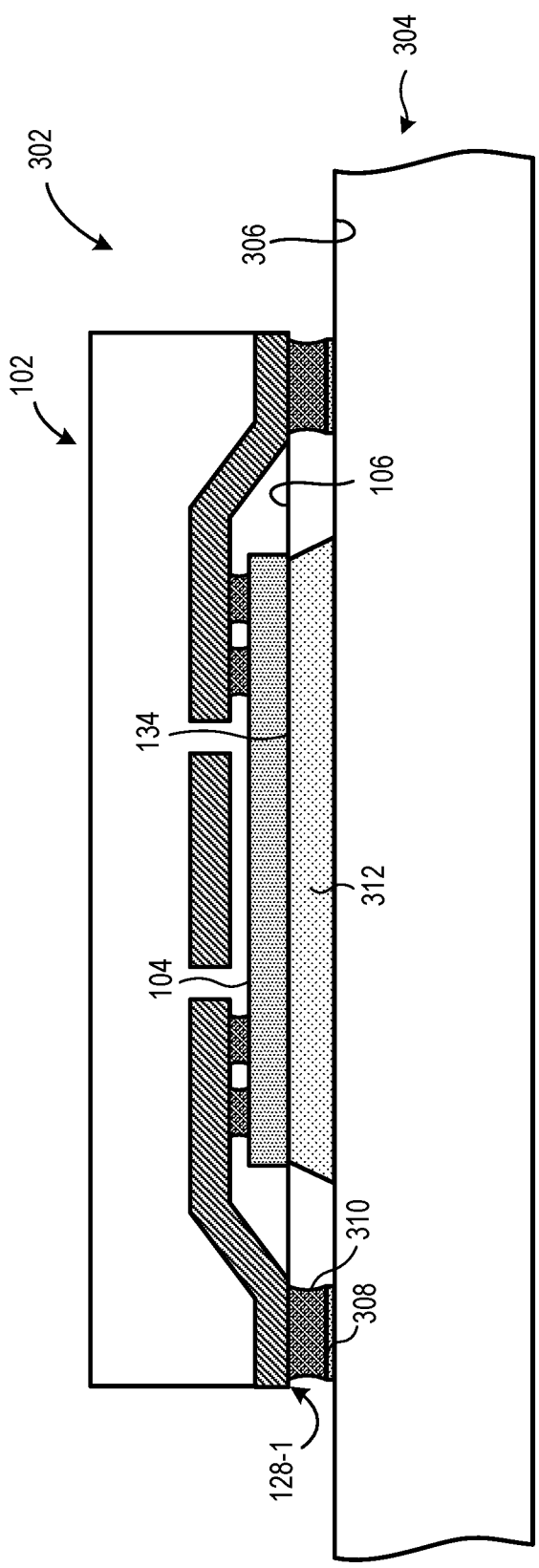
FIG. 3 is a diagram illustrating a cross-section view of an electronic device having the leadless semiconductor package of FIGS. 1 and 2 mounted on a circuit board in accordance with some embodiments.

FIG. 3 illustrates a cross-section view 300 of an electronic device 302 having a circuit board 304 with the package 102 mounted thereon in accordance with at least some embodiments. As illustrated, the package 102 is surface mounted to the circuit board 304. Accordingly, the package 102 is positioned and oriented such that the mounting surface 106 of the package 102 faces a corresponding surface 306 of the circuit board 304. Each of at least a subset of the package surface mount pads 128 (e.g., package surface mount pad 128-1) formed by the external surface 126 of the distal section 120 of a corresponding gull wing lead 116 is electrically and mechanically connected to a corresponding pad 308 of the circuit board 304 via a corresponding solder bump 310 or other conductive structure, and thus providing an electrically conductive path between the pad 308 and circuitry of the IC die 104 via the gull wing lead 116.

In the illustrated embodiment, the top surface 134 of the IC die 104 serves as part of the mounting surface 106 (that is, is externally accessible via the mounting surface 106). As such, a thermally conductive and/or electrically-conductive adhesive material 312 (e.g., thermally-conductive adhesive tape) is disposed between the top surface 134 of the IC die 104 and the surface 306 of the circuit board 304 so as to provide a direct mechanical, electrical, and/or thermal connection between the IC die 104 and the circuit board 304 or a heat sink formed thereon for purposes of heat extraction and/or providing a ground voltage connection to the IC die 104. Alternatively, in the event that the top surface 134 is recessed from the mounting surface 106 but accessible via an aperture formed at the mounting surface 106, a thermally/electrically conductive die attach paddle can be positioned in the aperture and thermally/electrically connected to the IC die 104 and then thermally/electrically connected to the circuit board 304 or a heat sink formed thereon via the adhesive material 312. Further, although not depicted for ease of illustration, a dielectric underfill material may be deposited between the package 102 and the circuit board 304 to provide a stronger mechanical bond and to further electrically isolate the individual electrical connections between the package 102 and the circuit board 304.

Figure 4:
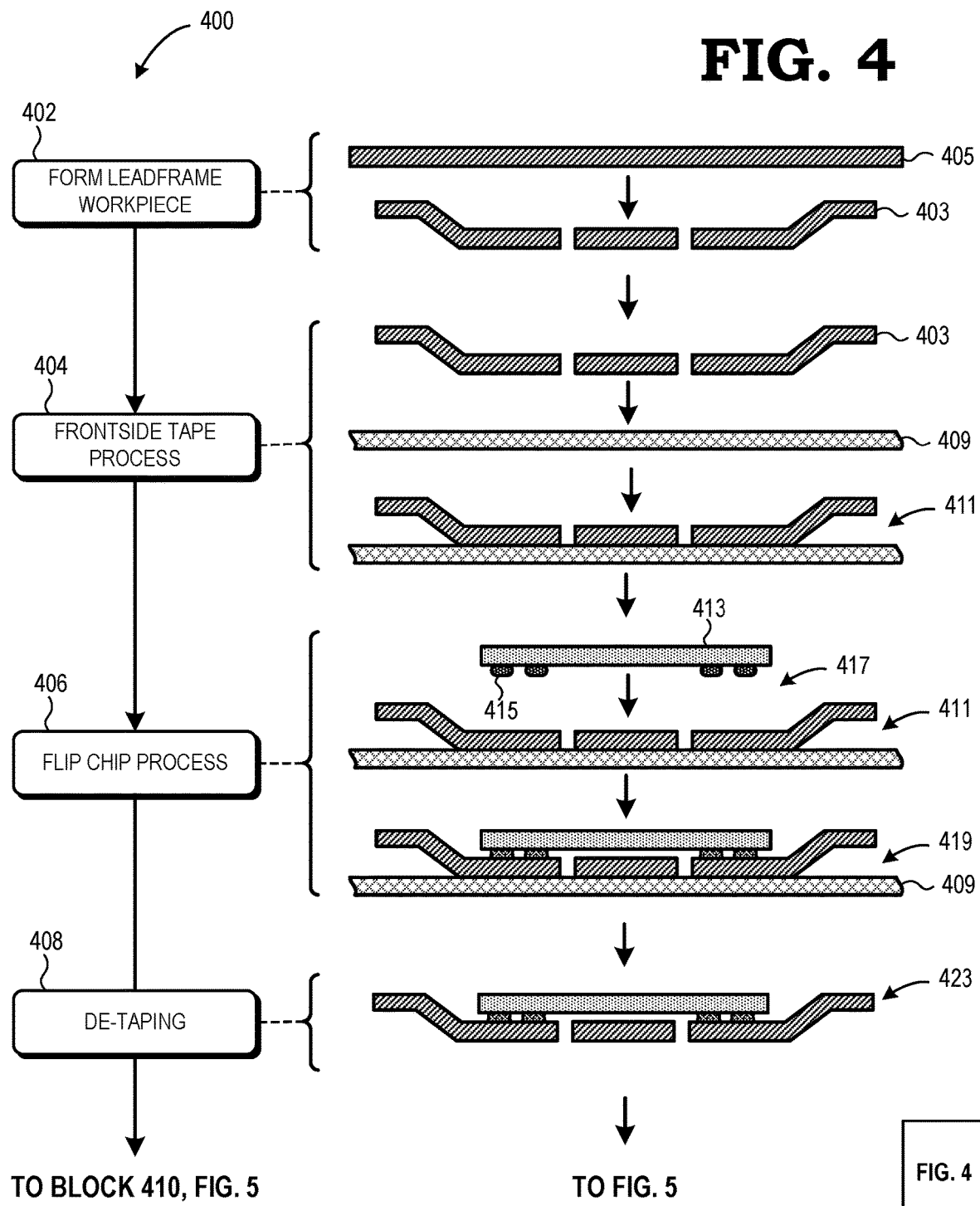
FIGS. 4 and 5 are diagrams that together illustrate a method of fabrication of a leadless semiconductor package having internal gull wing finger structures in accordance with some embodiments.
Figure 5:
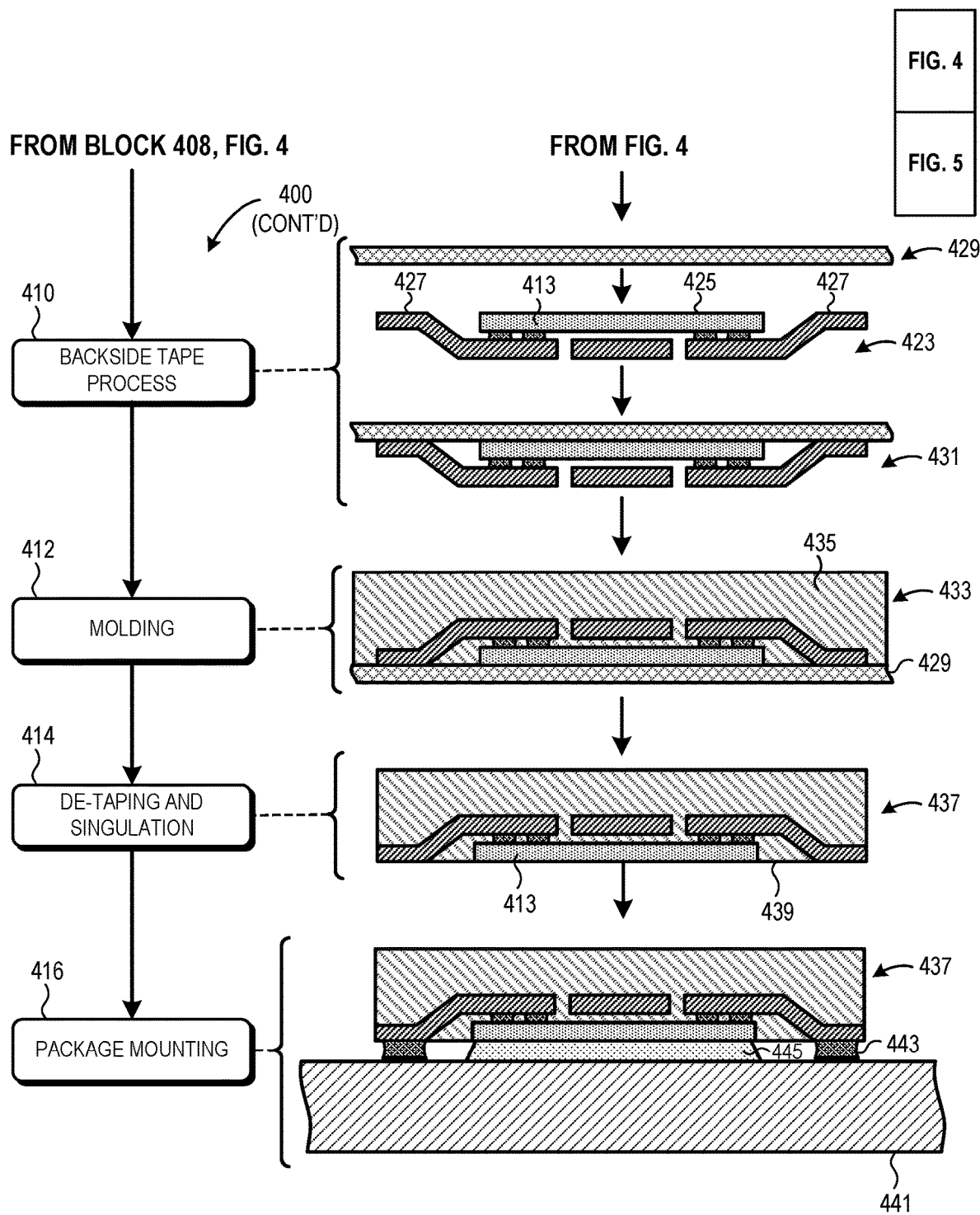

FIGS. 4 and 5 together illustrate a method 400 of fabrication of a leadless semiconductor package employing internal gull wing lead structures for die-to-surface connectivity and package surface mounting in accordance with some embodiments. For ease of illustration, the method 400 is described with reference to the package 102 of FIGS. 1-3, but the method 400 is not limited to this example description.

The method 400 initiates at block 402 with the fabrication or other obtainment of a workpiece 403 implementing the leadframe 110. To illustrate, in some embodiments, the leadframe 110 is formed from a flat sheet 405 of conductive material (e.g., copper or copper alloy) that is either stamped (for low lead-density implementations) or etched (for high lead-density implementations) to form the leadframe 110 with the plurality of gull wing leads 116 described above. For example, a process employed for forming the external gull wing leads of a quad flat package (QFP) can be adapted for use in fabrication of the internal gull wing leads 116 of the leadframe 110. Moreover, it will be appreciated that the workpiece 403 typically is one workpiece in a M×N array of leadframes (M, N>=1) being concurrently processed as a set, but is illustrated as a separate, single workpiece for ease of illustration and description.

At block 404, the workpiece 403 is subjected to a frontside tape process in which a "frontside" surface 407 of the leadframe workpiece 403 is adhered to an adhesive fabrication tape 409 (e.g., a polyimide film using a silicone-based adhesive) to form a taped workpiece 411. The fabrication tape 409 in turn is adhered to a support structure (not shown)

At block 406, a flip chip process is performed in which one or more IC die 413 (one embodiment of IC die 104) are obtained, each of the one or more IC die 413 having a set of solder balls or other pre-flow solder features 415 formed at die pads of the IC die 413. In the illustrated example, the solder features 415 are formed at corresponding pads on the active surface of the IC die 413, whereas in other embodiments the solder features 415 are formed on the inactive surface of the IC die 413 and then connected to the circuitry of the IC die using vias, TSVs, and the like. The IC die 413 is positioned in a concave region 417 (one embodiment of concave region 130) formed by gull wing leads of the leadframe workpiece 403 such that one or more solder features 415 are placed in contact with a facing surface of the proximal section of a corresponding gull wing lead (e.g., surface 132 of proximal section 118 of the gull wing lead 116), thereby forming a taped workpiece 419.

The taped workpiece 419 is then subjected to a solder reflow process to reflow the solder features to form corresponding solder bumps (e.g., solder bumps 138) mechanically and electrically coupling the IC die 413 to the leadframe workpiece 403. Typically, the temperature and duration needed for effective solder flow can lead to warpage in a long-finger-based leadframe, which in turn can negatively impact the die-to-long finger connection reliability. However, in the illustrated fabrication process, the IC die 413 is mounted on the proximal sections of gull wing leads and the proximal sections of the leadframe are supported by the fabrication tape 409 and the underlying support structure in a manner that does not readily facilitate warpage of the gull wing leads at the point of contact with the solder balls of the IC die 413 due to the flat and co-planar arrangement of the proximal sections of the gull wing leads and the flat and co-planar interface between these proximal sections and the fabrication tape and underlying support structure. As such, the heat and duration of the solder reflow process is less likely to lead to loss of co-planarity of the proximal sections of the gull wing leads, and thus less likely to exhibit poor die solder-bump-to-lead connectivity. After the solder reflow process, at block 408 the frontside fabrication tape 409 is removed from the workpiece, resulting in a de-taped workpiece 423 composed of the leadframe workpiece 403 and the IC die 104 mounted thereon.

Turning now to FIG. 5, the method 400 continues at block 410 with the workpiece 423 subjected to a backside tape process to adhere the "backside" of the workpiece 423 (that is, the top surface 425 of the IC die 413 and the surfaces 427 of the gull wing leads of the leadframe workpiece 403) to an adhesive fabrication tape 429 to form a taped workpiece 431.

At block 412, the workpiece 431 is subjected to a package molding process in which the workpiece 431 is positioned in the illustrated orientation and then encapsulated in an encapsulant material (e.g., plastic, epoxy resin, etc.) with the fabrication tape 429 serving as a molding retainer or molding barrier for the encapsulant material during the molding process, resulting in a molded package workpiece 433 having the IC die 413, leadframe workpiece 403, and other components at least partially encapsulated in the resulting package encapsulant 435 (one embodiment of package encapsulant 112). Through use of the fabrication tape 429 in this manner, the top surface 425 and the surfaces 427 remain substantially devoid of encapsulant material during the molding process, and thus results in these surfaces being co-planar, or flush, with the rest of the side of the workpiece that is to become the mounting surface of a resulting semiconductor package.

At block 414, the backside fabrication tape 429 is removed and the molded package workpiece 433 is separated from the other package workpieces in the lot via a singulation process, such as a saw singulation process or a punch singulation process, to generate a leadless semiconductor package 437 (one embodiment of package 102) employing internal gull wing leads that extend from an interior of the semiconductor package 437 to the mounting surface 439 of the semiconductor package 437 and thus serve as the package mounting pads for the semiconductor package and conductive pathways to the die pads of the IC die 413 disposed within the concave region 417 (FIG. 4) formed by the gull wing leads.

At block 416, the semiconductor package 437 is surface mounted to a circuit board 441 via solder bumps 443 electrically and mechanically connecting the surfaces 427 of the gull wing leads to corresponding board pads of the circuit board 441 and via electrically and/or thermally conductive material 445 disposed between the top surface of the IC die 413 and the facing surface of the circuit board 441, as described above with reference to FIG. 3.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method of fabricating a leadless semiconductor package, the method comprising:
   forming a leadframe having a plurality of internal gull wing lead structures that define a concave region, each gull wing lead structure having a proximal section and an opposing distal section proximate and internal to a perimeter of the leadless semiconductor package, a surface of the distal section forming a surface mount pad of the leadless semiconductor package; and
   affixing an integrated circuit (IC) die to the leadframe in the concave region such that each conductive bump of a plurality of conductive bumps of a first surface of the IC die is connected to a proximal end of a corresponding gull wing lead structure of the plurality of internal gull wing lead structures, wherein a second surface of the IC die is co-planar with the surfaces of the distal sections of the internal gull wing lead structures,
   wherein affixing the IC die to the leadframe comprises:
   adhering a first fabrication tape to surfaces of the proximal sections of the internal gull wing lead structures opposite the concave region; and
   performing a solder reflow process to reflow solder to form the plurality of conductive bumps while the first fabrication tape is adhered.

2. The method of claim 1, further comprising:
   removing the first fabrication tape after the solder reflow process and adhering a second fabrication tape to the surfaces of the distal sections of the internal gull wing lead structures; and
   performing a molding process to at least partially encapsulate the leadframe and the IC die using the second fabrication tape as a molding barrier.

3. The method of claim 2, wherein:
   the second fabrication tape is further adhered to the second surface of the IC die opposite the first surface; and
   the second surface of the IC die is part of a mounting surface of the leadless semiconductor package.

4. The method of claim 2, further comprising:
   removing the second fabrication tape; and
   performing a singulation process to separate the leadless semiconductor package from other workpieces.

5. A leadless semiconductor package formed in accordance with the method of claim 1.

6. The method of claim 1, wherein a mounting surface includes the second surface of the IC die opposite the first surface.

7. The method of claim 1, further comprising:
   encapsuling the leadless semiconductor package by a packaging encapsulant extending between a mounting surface and an opposing surface of the leadless semiconductor package and encapsulating the first surface of the IC die and the proximal sections of the internal gull wing lead structures.

8. The method of claim 1, wherein the internal gull wing leads are part of the leadframe.

9. An electronic device comprising a circuit board having the leadless semiconductor package formed by the method of claim 1 mounted thereon.

10. The electronic device of claim 9, wherein:
a mounting surface includes the second surface of the IC die opposite the first surface, and
the electronic device further comprises thermally conductive adhesive tape extending between the second surface of the IC die and a facing surface of the circuit board.

11. The method of claim 7,
wherein the mounting surface is exposed.

12. The method of claim 11, wherein the mounting surface is co-planar with the surface of the distal section.

\* \* \* \* \*